United States Patent
Seddon

(10) Patent No.: US 8,292,690 B2
(45) Date of Patent: Oct. 23, 2012

(54) THINNED SEMICONDUCTOR WAFER AND METHOD OF THINNING A SEMICONDUCTOR WAFER

(75) Inventor: Michael J. Seddon, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1080 days.

(21) Appl. No.: 12/206,043

(22) Filed: Sep. 8, 2008

(65) Prior Publication Data

US 2010/0059862 A1    Mar. 11, 2010

(51) Int. Cl.
*B24B 7/22* (2006.01)
(52) U.S. Cl. .................. 451/5; 451/63; 451/58
(58) Field of Classification Search .......... 451/28, 451/41, 58, 5, 63, 57
See application file for complete search history.

(56) References Cited

U.S. PATENT DOCUMENTS

| | | | | |
|---|---|---|---|---|
| 5,584,936 | A * | 12/1996 | Pickering et al. | 118/728 |
| 6,162,702 | A | 12/2000 | Morcom et al. | |
| 7,559,826 | B2 * | 7/2009 | Sekiya | 451/41 |
| 8,029,335 | B2 * | 10/2011 | Takahashi et al. | 451/11 |
| 2006/0118515 | A1 | 6/2006 | Dolechek et al. | |
| 2007/0007247 | A1 | 1/2007 | Sekiya | |

* cited by examiner

*Primary Examiner* — Robert Rose
(74) *Attorney, Agent, or Firm* — Rennie William Dover

(57) ABSTRACT

A thinned semiconductor wafer and a method for thinning the semiconductor wafer. A semiconductor wafer is thinned from its backside to form a cavity in a central region of the backside of the semiconductor wafer. Forming the cavity also forms a ring support structure in a peripheral region of the semiconductor wafer. The ring support structure has an inner edge and an outer edge. The inner edge may be beveled or have a stepped shape.

20 Claims, 3 Drawing Sheets

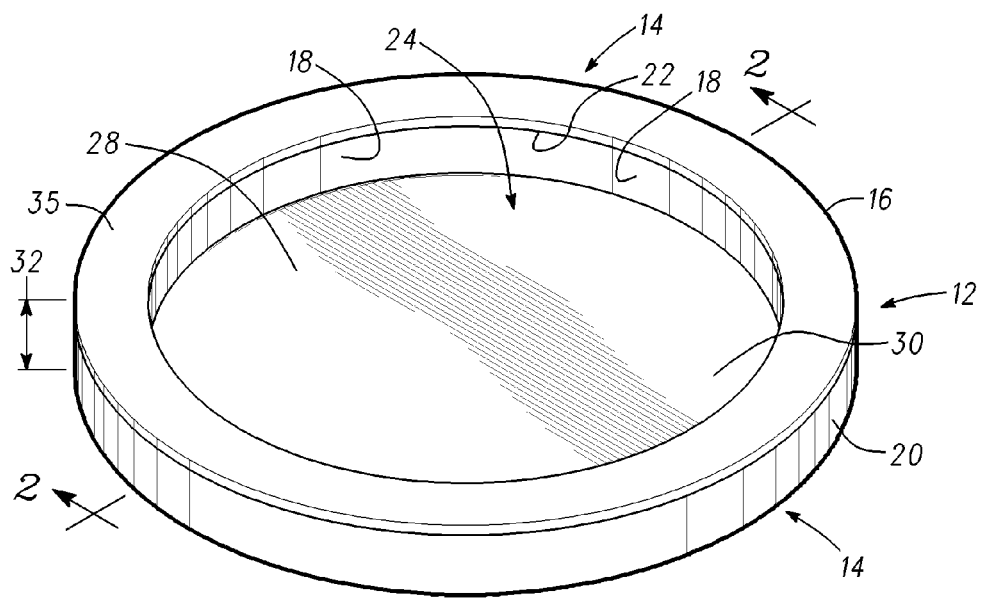
*Fig. 1* -PRIOR ART-
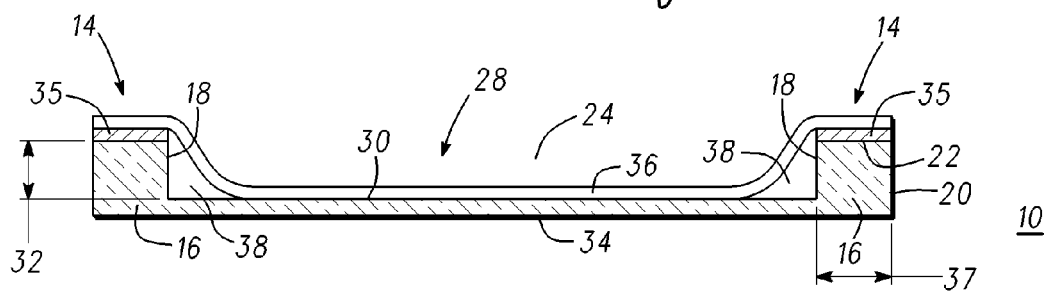
*Fig. 2* -PRIOR ART-
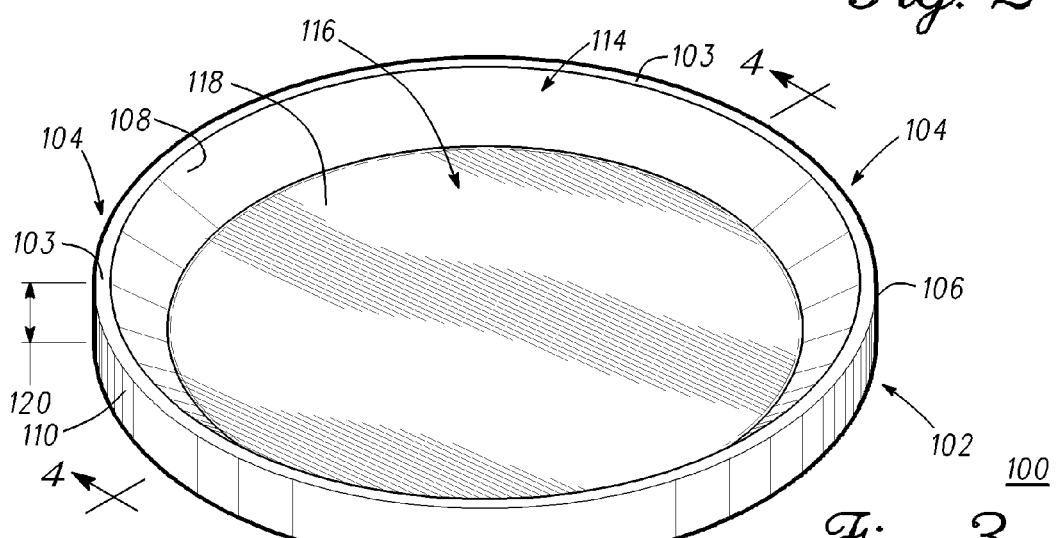
*Fig. 3*

THINNED SEMICONDUCTOR WAFER AND METHOD OF THINNING A SEMICONDUCTOR WAFER

TECHNICAL FIELD

The present invention relates, in general, to semiconductor wafers and, more particularly, to thinned semiconductor wafers.

BACKGROUND

Semiconductor component manufacturers are constantly striving to increase the performance of their products while decreasing their cost of manufacture. As those skilled in the art are aware, discrete semiconductor devices and integrated semiconductor devices such as integrated circuits are fabricated from semiconductor wafers which are then singulated or diced to produce semiconductor chips. The semiconductor wafers serve as the substrates from which semiconductor devices are manufactured and provide structural support during their manufacture. For adequate structural support, semiconductor wafers typically have a minimum thickness below which the wafers become warped and easily damaged, especially in a manufacturing environment. However, in many applications the thicker semiconductor wafers significantly degrade device performance. When device performance is an issue, semiconductor component manufacturers use thinned semiconductor wafers to take advantage of the performance benefits they give semiconductor devices even though they increase the cost of manufacturing the semiconductor devices. Techniques for thinning semiconductor wafers include wafer bonding, the use of a rigid tape support system, and back grinding the semiconductor wafer. Wafer bonding techniques greatly increase the cost of semiconductor components and rigid support systems cannot withstand the chemicals and temperatures used in manufacturing semiconductor components. Back grinding techniques are expensive and may damage the semiconductor wafers. FIG. 1 is an isometric view of a prior art semiconductor wafer 10 having a ring support structure 12 formed from a peripheral region 14 of semiconductor wafer 10 using a back grinding technique. Ring support structure 12 comprises a lip 16 having an inner edge 18, an outer edge 20, and a rim surface 22, which rim surface 22 may be a peripheral portion of the back surface of semiconductor wafer 10. A cavity 24 extends into a central region 28 of the body of semiconductor wafer 10 from its back surface and has a boundary surface 30 that is spaced apart from rim surface 22 by a distance 32. Distance 32 is further illustrated in FIG. 2. Thus, cavity 24 is bounded by inner edge 18 and boundary surface 30. A metallization layer 35 is formed on boundary surface 30, inner edge 18, and rim surface 22. After grinding, the portion of metallization layer 35 on rim surface 22 remains.

FIG. 2 is a cross-sectional view of semiconductor wafer 10 having ring support structure 12 taken along section line 2-2 of FIG. 1 after attaching a dicing tape 36 to boundary surface 30 and the portion of metallization layer 35 that is over rim surface 22. What is shown in FIG. 2 is semiconductor wafer 10 having a front or major surface 34, a central region 28, peripheral region 14, lip 16, and cavity 24 extending into semiconductor wafer 10. It should be noted that inner edge 18 is perpendicular to boundary surface 30, rim surface 22 is substantially parallel to boundary surface 30, inner edge 18 is substantially parallel to outer edge 20, and a width 37 of lip 16 is substantially constant. After forming cavity 24, dicing tape 36 is attached to metallization layer 35 that is on rim surface 22 and on boundary surface 30. A drawback of forming lip 16 having inner edge 18 perpendicular to boundary surface 30 is that tape 36 fails to adhere to the portions of metallization layer 35 in the regions where inner edge 18 and boundary surface 30 meet, leaving a gap 38, which decreases the stability of thinned semiconductor wafer 10. In a subsequent step (not shown), a grinding wheel is used to thin lip 16. Another drawback with forming inner edge 18 of lip 16 to be perpendicular to boundary surface 30 is that the grinding wheel simultaneously contacts a large area of a backside metallization layer (not shown) during the step of thinning lip 16, thereby loading up the grinding wheel which impedes the self dressing features of the grinding wheel, increases the grinding current, and creates stresses in semiconductor wafer 10. A method for mitigating these drawbacks has been to use large grit grinding wheels. However, large grit grinding wheels limit the overall height to which the ring support structure can be ground. In addition, the larger grit grinding wheels create larger particles that scratch or damage the back side of semiconductor wafer 10. The larger grit grinding wheels also chip the semiconductor wafers which leads to increased breakage of the semiconductor wafers. Other drawbacks of forming lip 16 having inner edge 18 perpendicular to boundary surface 30 are that it subjects the grinding wheel to increased vibration and wear, and slurry and water become trapped at the corners of ring support structure 12 because they cannot flow around the grinding wheel.

Accordingly, it would be advantageous to have a thinned semiconductor wafer and a method for thinning the semiconductor wafer. It would be of further advantage for the method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 1 is an isometric view of a prior art semiconductor wafer having a ring support structure;

FIG. 2 is a cross-sectional view of the semiconductor wafer of FIG. 1 taken along section line 2-2 of FIG. 1 at a later stage of manufacture;

FIG. 3 is an isometric view of a semiconductor wafer having a beveled ring support structure in accordance with an embodiment of the present invention;

DETAILED DESCRIPTION

Figure 4:
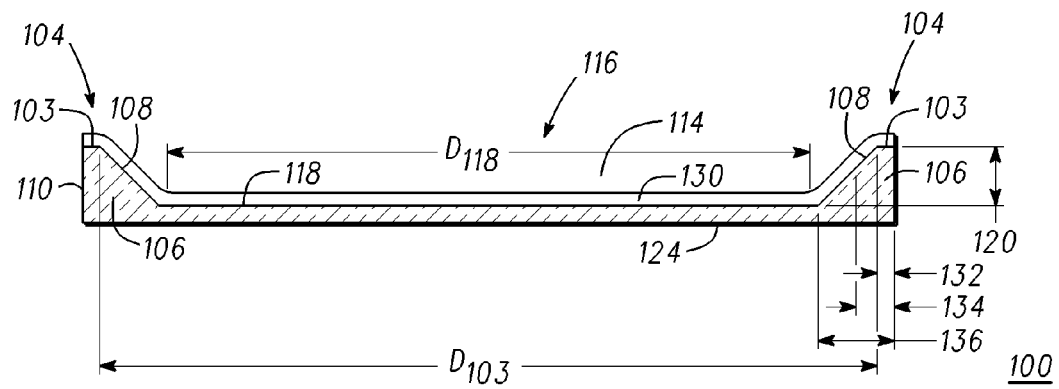
FIG. 4 is a cross-sectional view of the semiconductor wafer of FIG. 3 taken along section line 4-4 of FIG. 3 at a later stage of manufacture.

Generally, the present invention provides a method of forming a ring support structure suitable for use in thinning a semiconductor wafer for manufacturing semiconductor components. In accordance an embodiment of the present invention, a ring support structure is formed from a peripheral portion of a semiconductor wafer, wherein the ring support structure comprises a rim or lip having an edge that makes a non-perpendicular angle with a surface of the semiconductor wafer. The edge of the lip may have a beveled shape, a stepped shape, or the like. The ring support structure is also referred to as an edge support structure.

FIG. 3 is an isometric view of a semiconductor wafer 100 having a ring support structure 102 formed from a peripheral region 104 of semiconductor wafer 100 in accordance with an embodiment of the present invention. Ring support structure 102 comprises a lip 106 having a beveled or tapered inner edge 108, an outer edge 110, and a rim surface 103, which rim surface 103 may be a peripheral portion of the back surface of semiconductor wafer 100. Beveled or tapered inner edge 108 is also referred to as a beveled portion or a beveled structure. A cavity 114 extends into a central region 116 of the body of semiconductor wafer 100 from its back surface and has a boundary surface 118 that is spaced apart from rim surface 103 by a distance 120. Distance 120 is further illustrated in FIG. 4. Thus, cavity 114 is bounded by beveled or tapered edge 108 and boundary surface 118. It should be noted that the portion of lip 106 at rim surface 103 is referred to as a rim support portion or a support portion of rim support structure 102. Likewise, the portion of lip 106 near boundary surface 118 and the portions of lip 106 between rim surface 103 and boundary surface 118 are referred to as rim support portions or support portions of rim support structure 102. Preferably, the widths of the rim support portions are different from each other. For example, the width of the rim support portion near boundary surface 118 is greater than the width of the rim support portion near rim surface 103 and greater than the widths of the rim support portions between boundary surface 103 and rim surface 118. Thus, the diameter of cavity 114 near boundary surface 118 is less than the diameter of cavity 114 near rim surface 103. The diameter of cavity 114 is further illustrated with reference to FIG. 4.

FIG. 4 is a cross-sectional view of semiconductor wafer 100 taken along section line 4-4 of FIG. 3 after a dicing tape 130 has been attached to rim surface 103, tapered inner edge 108, and boundary surface 118. What is shown in FIG. 4 is semiconductor wafer 100 having a front or major surface 124, central region 116, peripheral region 104, lip 106, and cavity 114 extending into semiconductor wafer 100 from its backside. A grinding wheel may be used to form beveled or tapered inner edge 108. It should be noted that beveled or tapered inner edge 108 makes an angle with boundary surface 118 that is not perpendicular and that rim surface 103 is substantially parallel to boundary surface 118. The width of lip 106 at rim surface 103, i.e., the width of the rim support portion at rim surface 103, is identified by reference character 132. The width of lip 106 at boundary surface 118, i.e., the width of the rim support portion at boundary surface 118, is identified by reference character 136 and the width of lip 106 at a location between rim surface 103 and boundary surface 118, i.e., the width of the rim support portion between boundary surface 118 and rim surface 103, is identified by reference character 134. Because inner edge 108 of lip 106 is beveled, width 136 is greater than width 134 and width 134 is greater than width 132. It should be noted that the diameter of cavity 114 near rim surface 103, identified by arrows $D_{103}$, is greater than the diameter of cavity 114 near boundary surface 118, identified by arrows $D_{118}$. Dicing tape 130 is attached to rim surface 103, beveled or tapered inner edge 108, and boundary surface 118. Beveling lip 106 is advantageous because it substantially reduces or eliminates the air gap between dicing tape 130 and semiconductor wafer 100. In addition it improves grinding wheel wear on the leading edge of the grinding wheel which increases the dressing interval, and it improves the water flow characteristics near the edge of the wafer which reduces contamination.

Figure 5:
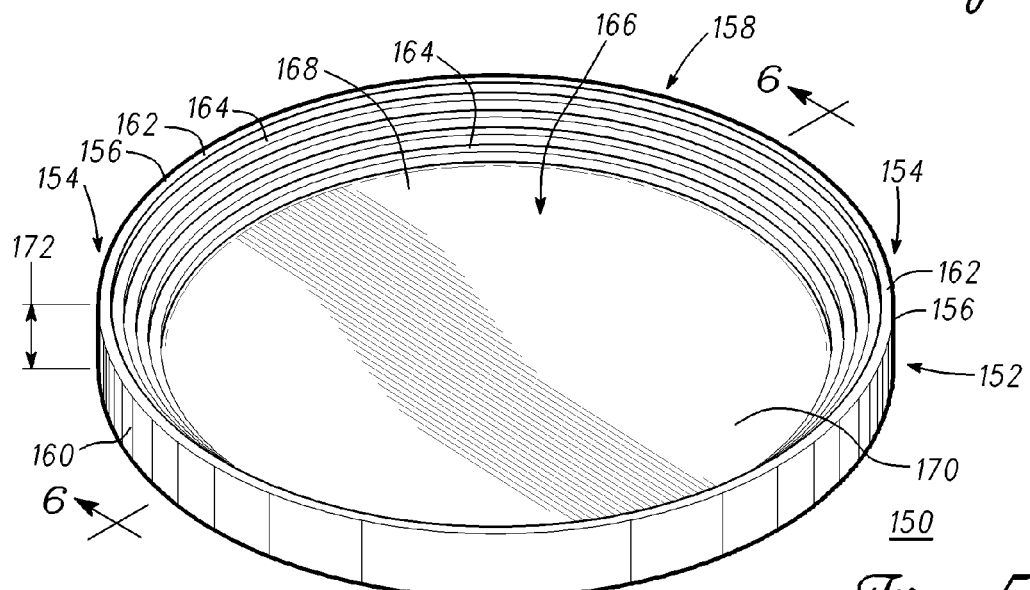
FIG. 5 is an isometric view of a semiconductor wafer having a stepped ring support structure in accordance with another embodiment of the present invention.

FIG. 5 is an isometric view of a semiconductor wafer 150 having a ring support structure 152 formed from a peripheral region 154 of semiconductor wafer 150 in accordance with another embodiment of the present invention. Ring support structure 152 comprises a lip 156 having a stepped inner edge 158, an outer edge 160, and a rim surface 162, which rim surface 162 may be a peripheral portion of the back surface of semiconductor wafer 150. Stepped inner edge 158 comprises a plurality of steps 164 each having a horizontal surface and a vertical surface and may be referred to as a stepped structure. A cavity 166 extends into a central region 168 of the body of semiconductor wafer 150 from its back surface and has a boundary surface 170 that is spaced apart from rim surface 162 by a distance 172. Thus, cavity 166 is bounded by beveled or stepped edge 158 and boundary surface 170. It should be noted that the portion of lip 156 at rim surface 162 is referred to as a rim support portion or a support portion of rim support structure 152. Likewise, the portion of lip 156 near boundary surface 170 and the portions of lip 156 between rim surface 162 and boundary surface 170 are referred to as rim support portions or support portions of rim support structure 152. Preferably, the widths of the rim support portions are different from each other. For example, the width of the rim support portion near boundary surface 170 is greater than the width of the rim support portion near rim surface 162 and greater than the widths of the rim support portions between boundary surface 170 and rim surface 162. Thus, the diameter of cavity 166 near boundary surface 170 is less than the diameter of cavity 166 near rim surface 162. The diameters of cavity 166 are further described with reference to FIG. 6.

Figure 6:
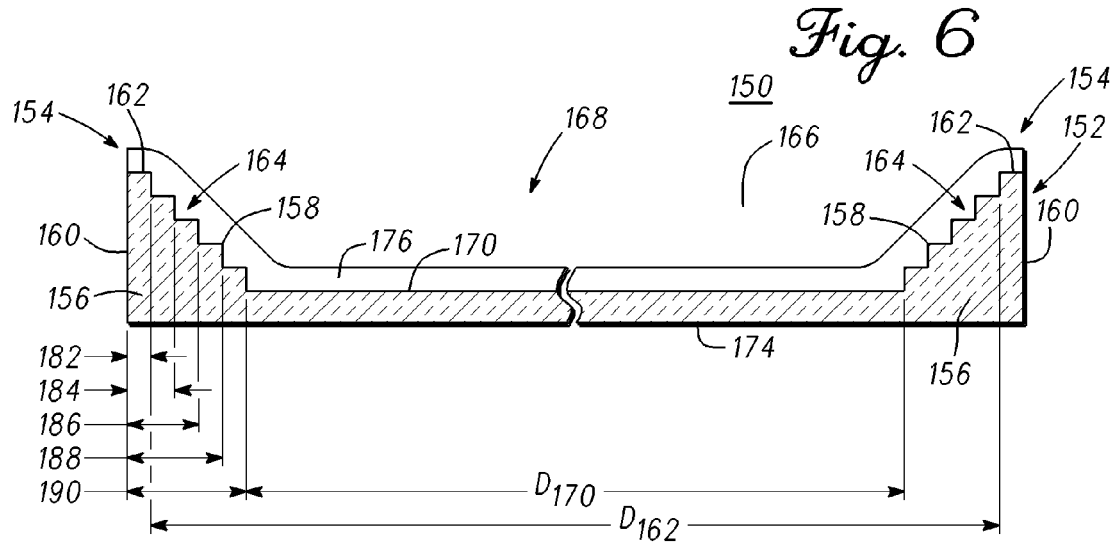
FIG. 6 is a cross-sectional view of the semiconductor wafer of FIG. 5 taken along section line 6-6 of FIG. 5 at a later stage of manufacture.

FIG. 6 is a cross-sectional view of semiconductor wafer 150 taken along section line 6-6 of FIG. 5 after a dicing tape 176 has been attached to rim surface 162, stepped inner edge 158, and boundary surface 170. What is shown in FIG. 6 is semiconductor wafer 150 having a front or major surface 174, central region 168, peripheral region 154, lip 156, and cavity 166 extending into semiconductor wafer 150 from its backside. A grinding wheel may be used to form a beveled or tapered inner edge 158. The width of lip 156 at rim surface 162 is identified by reference character 182 and the width of lip 156 at boundary surface 170 is identified by reference character 190. A dimension such as, for example, the widths of the steps between rim surface 162 and boundary surface 170 are identified by reference characters 184, 186, and 188. Because inner edge 158 of lip 156 is stepped, width 190 is greater than width 188, width 188 is greater width 186, width 186 is greater than width 184, and width 184 is greater than width 182. Preferably, the each step of the plurality of steps has a different width from the other steps of the plurality of steps. The widths of one or more of the steps of plurality of steps 164 are greater than the diameter of the grinding wheel. It should be noted that the diameter of cavity 166 near rim surface 162, identified by arrows $D_{162}$, is greater than the diameter of cavity 166 near boundary surface 170, identified by arrows $D_{170}$. Dicing tape 176 is attached to rim surface 162, stepped inner edge 158, and boundary surface 170. Making lip 156 stepped is advantageous because it substantially reduces or eliminates the air gap between dicing tape 176 and semiconductor wafer 150. In addition it improves grinding wheel wear on the leading edge of the grinding wheel which increases the dressing interval and improves the water flow characteristics near the edge of the wafer thereby reducing contamination.

Figure 7:
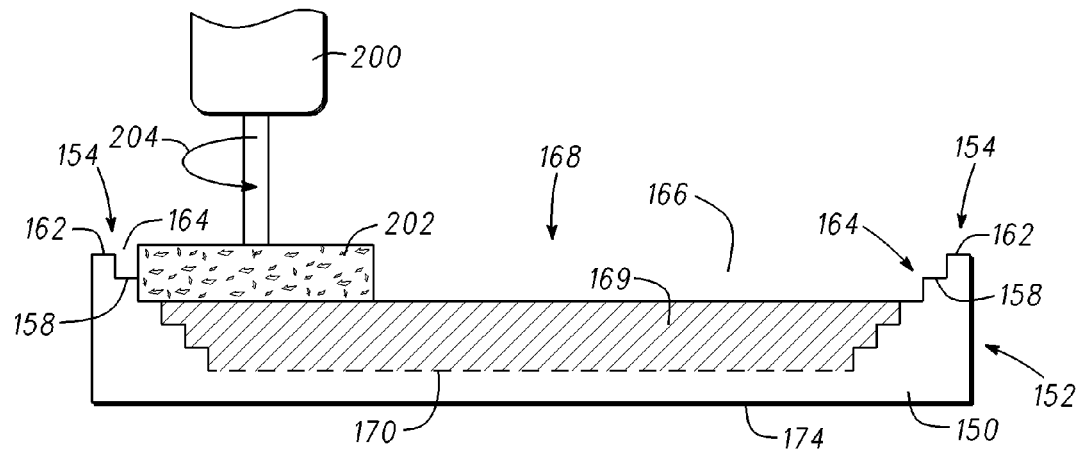
FIG. 7 is a cross-sectional view of a grinder having a grinding wheel forming a ring support structure in accordance with embodiments of the present invention.

FIG. 7 is a cross-sectional view of a grinder 200 having a grinding wheel 202 that is forming ring support structure 152 from peripheral region 154 of semiconductor wafer 150. More particularly, FIG. 7 illustrates the formation of stepped inner edge 158. Grinding wheel 202 rotates in a direction indicated by arrow 204 while being pressed against the back surface of semiconductor wafer 150. In addition, grinding wheel 202 is moved laterally, i.e., in a direction substantially parallel to rim surface 162 or major surface 174, to form stepped inner edge 158 and cavity 166. Preferably, grinder 200 is programmed to move grinding wheel 202. One or more steps of stepped inner edge or stepped structure 158 may be formed by laterally moving the grinding wheel one distance to make a step and another distance that is less than the one distance to make another step. This is repeated for each successive step where the lateral distance for the formation of each subsequent step is less than the lateral distance for the formation of a previous step. The number of steps in stepped inner edge 158 is a parameter selected by the semiconductor component manufacturer. It should be noted that the cross-hatched portion identified by reference character 169 represents semiconductor material that will be removed by grinding wheel 202 during the grinding process. Because boundary surface 170 has not been formed at the point in the grinding process illustrated in FIG. 7, it has been identified by a broken line.

Figure 8:
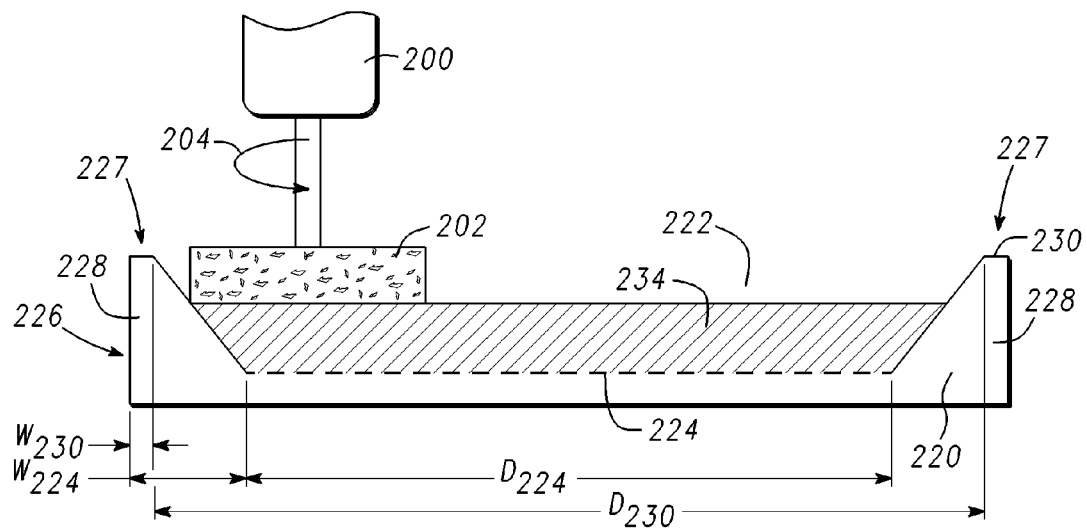
FIG. 8 is a cross-sectional view of a grinder having a grinding wheel forming a ring support structure in accordance with additional embodiments of the present invention.

FIG. 8 is a cross-sectional view of a grinder 200 forming a ring support structure 226 from a peripheral region 227 of a semiconductor wafer 220. More particularly, FIG. 8 illustrates the formation of ring support structure 226 comprising a lip 228 having a rim surface 230. Grinder 200 is programmed so that grinding wheel 202 spirals down into semiconductor wafer 220 to form a cavity 222 having a boundary surface 224 and to form rim support structure 226. Because boundary surface 224 has not been formed at the point in the grinding process illustrated in FIG. 8, it has been identified by a broken line. In this embodiment, the diameter of cavity 222 formed in semiconductor wafer 220 decreases as the grinding wheel spirals into semiconductor wafer 220. Thus, the diameter of the portion of cavity 222 near rim surface 230, identified by arrows $D_{230}$, is greater than the diameter of the portion of cavity 222 near boundary surface 224, identified by arrows $D_{224}$, whereas the width of the portion of rim support structure 226 near rim surface 230, identified by arrows $W_{230}$, is less than the width of the portion of rim support structure 226 near boundary surface 224, identified by arrows $W_{224}$. It should be noted that the cross-hatched portion identified by reference character 234 represents semiconductor material that will be removed by grinding wheel 202 during the grinding process but has not been removed at the point in the grinding process illustrated in FIG. 8.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for thinning a semiconductor wafer, comprising:
   providing the semiconductor wafer having first and second sides and a major surface;
   removing a first portion of the semiconductor material by grinding the semiconductor wafer from the second side using a grinding wheel to form a first portion of a cavity having a first depth and a first lateral dimension;
   removing a second portion of the semiconductor material by grinding the semiconductor wafer from the second side using the grinding wheel to form a second portion of the cavity having a second depth and a second lateral dimension;
   removing a third portion of the semiconductor material by grinding the semiconductor wafer from the second side using the grinding wheel to form a third portion of the cavity having a third depth and a third lateral dimension;
   removing a fourth portion of the semiconductor material by grinding the semiconductor wafer from the second side using the grinding wheel to form a fourth portion of the cavity having a fourth depth and a fourth lateral dimension to form a ring support structure in the second side of the semiconductor wafer, wherein the ring support structure has first and second support portions and wherein a width of the second support portion is greater than a width of the first support portion, wherein the first lateral dimension is greater than the second lateral dimension which is greater than the third lateral dimension.

2. The method of claim 1, wherein removing the first, second, third, and fourth portions of the ring support structure includes forming the ring support structure as a stepped structure.

3. The method of claim 1, wherein grinding the semiconductor wafer comprises:
   grinding from the back side of the semiconductor wafer to form a first step having a first width; and
   grinding from the back side of the semiconductor wafer to form a second step having a second width, the second width greater than the first width.

4. The method of claim 3, wherein grinding the semiconductor wafer comprises grinding the back side of the semiconductor wafer to form a plurality of steps.

5. The method of claim 4, wherein each step of the plurality of steps has a different width from the other steps of the plurality of steps.

6. The method of claim 3, further including using the grinding wheel to form the plurality of steps and wherein the width of one or more of the steps of the plurality of steps is greater than the diameter of the grinding wheel.

7. The method of claim 2, wherein removing the first, second, and third portions of the semiconductor material includes moving the grinding wheel in a direction substantially parallel to the major surface.

8. The method of claim 7, further including:
   laterally moving the grinding wheel a first distance to form a first step of the stepped structure; and
   laterally moving the grinding wheel a second distance to form a second step of the stepped structure, the second distance less that the first distance.

9. The method of claim 7, further including programming the grinder to move the grinding wheel.

10. The method of claim 1, wherein removing the first, second, and third portions of the semiconductor material further includes spiraling the grinding wheel into the semiconductor wafer.

11. A method for forming a ring support structure from a semiconductor wafer, comprising:
   providing the semiconductor wafer having first and second surfaces on first and second sides of the semiconductor wafer, respectively;

removing a plurality of portions of the semiconductor wafer from the second side to form a cavity, wherein removing the plurality of portions comprises:
   removing a first portion of the semiconductor wafer from the second side to form a first portion of the cavity, the first portion of the cavity having a first lateral dimension and a first vertical dimension;
   removing a second portion of the semiconductor wafer from the second side to form a second portion of the cavity, the second portion of the cavity having a second lateral dimension and a second vertical dimension; and
   removing a third portion of the semiconductor wafer from the second side to form a third portion of the cavity, the third portion of the cavity having a third lateral dimension and a third vertical dimension, the second lateral dimension greater than the first lateral dimension, wherein the first vertical dimension and the first lateral dimension in cooperation with the second vertical dimension and the second lateral dimension and the third vertical dimension and the third lateral dimension form a line having a substantially constant slope.

12. The method of claim 11, wherein removing the first and second portions forms a stepped structure.

13. The method of claim 11, wherein removing the first and second portions forms a beveled structure.

14. The method of claim 11, further including using a grinding wheel to remove the plurality of portions.

15. The method of claim 14, wherein using the grinding wheel includes moving the grinding wheel along the backside of the semiconductor wafer in a direction substantially parallel to the first major surface.

16. The method of claim 15, further including programming a grinder to move the grinding wheel.

17. A semiconductor wafer having a major surface, first and second edges, and a ring support structure, wherein the ring support structure comprises a rim having at least first, second, third, and fourth portions, wherein the first portion has a first width and a first depth, the second portion has a second width and a second depth, the third portion has a third width and a third depth, and the fourth portion has a fourth width and a fourth depth, the second width greater than the first width, the third width greater than the second width, and the fourth width greater than the third width, and wherein the major surface extends from the first edge to the second edge of the semiconductor wafer.

18. The semiconductor wafer of claim 17, wherein the rim has a beveled portion that extends from the first portion to the fourth portion.

19. The semiconductor wafer of claim 17, wherein the rim has a stepped portion.

20. The semiconductor wafer of claim 19, wherein the ring support structure has first and second edges, and wherein the stepped portion is formed from the first edge.

* * * * *